United States Patent
Inoue et al.

(10) Patent No.: US 10,047,919 B2
(45) Date of Patent: Aug. 14, 2018

(54) FLUORESCENT LIGHT SOURCE DEVICE, AND METHOD FOR MANUFACTURING SAME

(71) Applicant: USHIO DENKI KABUSHIKI KAISHA, Tokyo (JP)

(72) Inventors: Masaki Inoue, Himeji (JP); Seiji Kitamura, Himeji (JP)

(73) Assignee: USHIO DENKI KABUSHIKI KAISHA, Tokyo (JP)

(*) Notice: Subject to any disclaimer, the term of this patent is extended or adjusted under 35 U.S.C. 154(b) by 166 days.

(21) Appl. No.: 15/023,142

(22) PCT Filed: Sep. 11, 2014

(86) PCT No.: PCT/JP2014/074092
§ 371 (c)(1),
(2) Date: Mar. 18, 2016

(87) PCT Pub. No.: WO2015/041138
PCT Pub. Date: Mar. 26, 2015

(65) Prior Publication Data
US 2016/0230945 A1  Aug. 11, 2016

(30) Foreign Application Priority Data

Sep. 20, 2013 (JP) ................................ 2013-195292

(51) Int. Cl.
*F21K 9/64* (2016.01)
*H05B 33/14* (2006.01)
(Continued)

(52) U.S. Cl.
CPC ................ *F21K 9/64* (2016.08); *H01S 5/005* (2013.01); *H05B 33/14* (2013.01); *F21V 9/30* (2018.02);
(Continued)

(58) Field of Classification Search
CPC . F21K 9/64; H01S 5/005; H05B 33/14; F21Y 2115/30; F21Y 2101/00; F21V 9/30
See application file for complete search history.

(56) References Cited

U.S. PATENT DOCUMENTS

2006/0244969 A1* 11/2006 Ryan ................. G01N 21/47
356/446
2009/0140276 A1* 6/2009 Kuratate ................ H01J 61/35
257/98
2011/0216550 A1  9/2011 Koike et al.

FOREIGN PATENT DOCUMENTS

JP     2004-294566 A   10/2004
JP     2008-060092 A    3/2008
(Continued)

OTHER PUBLICATIONS

An Office Action; "Decision of Refusal," issued by the Japanese Patent Office dated Feb. 16, 2016, which corresponds to Japanese Patent Application No. 2013-195292 and is related to U.S. Appl. No. 15/023,142; with English language translation.
(Continued)

*Primary Examiner* — Mary Ellen Bowman
(74) *Attorney, Agent, or Firm* — Studebaker & Brackett PC (57) ABSTRACT

A fluorescent light source device includes a wavelength conversion member formed of a phosphor to be excited by excitation light. The wavelength conversion member includes a fluorescent member containing the phosphor, and a photonic structure part formed on the fluorescent member. An upper surface of the photonic structure part serves as a fluorescent light emitting surface of the wavelength conversion member. The photonic structure part is made from an inorganic compound layer that may be formed of a metal oxide and has a columnar structure extending in a direction away from the fluorescent member.

19 Claims, 4 Drawing Sheets

(51) Int. Cl.
*H01S 5/00* (2006.01)
*F21Y 101/00* (2016.01)
*F21Y 115/30* (2016.01)
*F21V 9/30* (2018.01)

(52) U.S. Cl.
CPC ....... *F21Y 2101/00* (2013.01); *F21Y 2115/30* (2016.08)

(56) References Cited

FOREIGN PATENT DOCUMENTS

| | | | |
|---|---|---|---|
| JP | 2009-175238 A | | 8/2009 |
| JP | 2009175238 A | * | 8/2009 |
| JP | 2011-198560 A | | 10/2011 |
| WO | 2006/080299 A1 | | 8/2006 |
| WO | 2012-108384 A1 | | 8/2012 |

OTHER PUBLICATIONS

An Office Action; "Notice of Reasons for Rejection," issued by the Japanese Patent Office dated Sep. 29, 2015, which corresponds to Japanese Patent Application No. 2013-195292 and is related to U.S. Appl. No. 15/023,142; with English language translation.
International Search Report issued in PCT/JP2014/074092; dated Nov. 18, 2014.

* cited by examiner

FLUORESCENT LIGHT SOURCE DEVICE, AND METHOD FOR MANUFACTURING SAME

TECHNICAL FIELD

The present invention relates to a fluorescent light source device that excites a phosphor (fluorescent material) with excitation light to cause the phosphor to emit fluorescent light, and also relates to a method for manufacturing such fluorescent light source device.

BACKGROUND ART

In related art, a fluorescent light source device is known in which laser light is applied as excitation light to a phosphor to cause the phosphor to emit fluorescent light.

Figure 16:
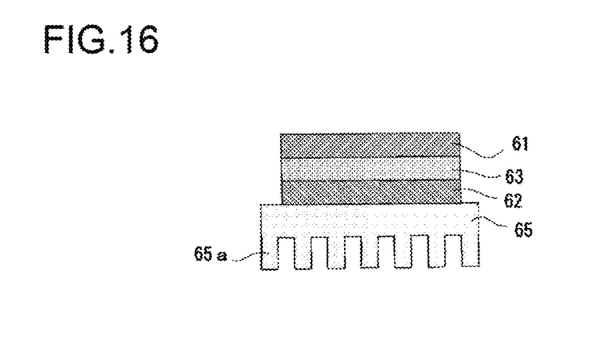
FIG. 16 is a cross-sectional view useful to illustrate a structure of a wavelength conversion member in a conventional fluorescent light source device.

As illustrated in FIG. 16 of the accompanying drawings, one kind of such fluorescent light source devices includes a wavelength conversion member. In the wavelength conversion member, a fluorescent member 61 formed of a YAG sintered body (sintered compact) is disposed on an upper surface (front surface) of a substrate 62 formed of an AlN sintered body, with a barium sulfate layer 63 interposed therebetween (for example, see Patent Literature Document 1). A heat radiation member 65 having a heat radiation (dissipation) fin 65a is provided on a lower surface (back surface) of the substrate 62. In the fluorescent light source device, an upper surface of the fluorescent member 61 serves as an excitation light receiving surface of the wavelength conversion member and also serves as a fluorescent light emitting surface.

In such fluorescent light source device, however, it is difficult to emit fluorescent light, which is generated inside the fluorescent member 61, from the fluorescent light emitting surface with high efficiency. Thus, there is a problem that the fluorescent light is not used effectively. In addition, the fluorescent member 61 is heated by the fluorescent light that cannot exit from the fluorescent light emitting surface. This results in high temperature of the phosphor itself, and in turn causes temperature quenching. Accordingly, sufficient fluorescent light flux is not obtained.

To deal with such problem of the fluorescent light source device, there is known a technology that provides, on a surface configured to serve as the fluorescent light emitting surface of the wavelength conversion member, a periodic (cyclic) structure in which projections are arranged periodically, in order to improve emission efficiency of the fluorescent light from the fluorescent light emitting surface.

However, it is difficult to form a fine rugged (concave-convex) structure with a desired size on the fluorescent member itself because the fluorescent member is formed of a single-crystal or poly-crystal phosphor such as a YAG sintered body.

Accordingly, another technology is studied. Specifically, a periodic structure layer that is made from an easy-to-machine material such as a polymer material is stacked on a fluorescent member. The periodic structure layer includes projections arranged on the surface thereof. The periodic structure layer serves as the periodic structure. However, in particular, when the surface of a periodic structure layer is used as a fluorescent light emitting surface and also as an excitation light receiving surface, the shape of the periodic structure layer is deformed by heat of the laser light (i.e., excitation light), and emission efficiency of the fluorescent light from the fluorescent light emitting surface of the wavelength conversion member drops due to the deformation of the periodic structure layer.

LISTING OF REFERENCES

Patent Literature Documents

PATENT LITERATURE DOCUMENT 1: Japanese Patent Application Laid-Open Publication No. 2011-198560

SUMMARY OF THE INVENTION

Problems to be Solved by the Invention

The present invention is developed under such circumstances, and an object of the invention is to provide a fluorescent light source device that can effectively use fluorescent light, which is generated inside a wavelength conversion member, to emit the fluorescent light to outside with high efficiency, thereby achieving high emission efficiency.

Another object of the invention is to provide a method for easily manufacturing a fluorescent light source device that effectively uses fluorescent light, which is generated inside a wavelength conversion member, to emit the fluorescent light to outside with high efficiency and to achieve high emission efficiency.

Solution to the Problems

A fluorescent light source device according to one aspect of the present invention includes a wavelength conversion member formed of a phosphor that is to be excited by excitation light. The wavelength conversion member includes a fluorescent member, which contains the phosphor, and a photonic structure part disposed on the fluorescent member. The photonic structure part has a surface that serves as a fluorescent light emitting surface of the wavelength conversion member. The photonic structure part has an inorganic compound layer. The inorganic compound layer is formed of a metal oxide and has a columnar structure extending in a direction away from the fluorescent member.

In the fluorescent light source device according to the present invention, the photonic structure part may have, on a surface of the inorganic compound layer, a periodical structure. The periodical structure may have a plurality of projections that are arranged two-dimensionally and periodically. Each of the projections may be defined by a column unit of the inorganic compound layer.

A method of manufacturing a fluorescent light source device according to an aspect of the present invention is a method of manufacturing the fluorescent light source device that has a wavelength conversion member formed of a phosphor. The phosphor is excited by excitation light. The method includes forming an inorganic compound layer on a fluorescent member. The fluorescent member contains the phosphor. The inorganic compound layer is made from a metal oxide, and has a columnar structure extending in a direction away from the fluorescent member. The method also includes etching a surface of the inorganic compound layer to form the wavelength conversion member. The wavelength conversion member has the fluorescent member and a photonic structure part. The photonic structure part includes the inorganic compound layer having the etched surface.

In the method of manufacturing the fluorescent light source device according to the present invention, the inorganic compound layer may be preferably formed through sputtering.

Advantageous Effects of the Invention

In the fluorescent light source device according to the present invention, the wavelength conversion member includes the fluorescent member and the photonic structure part disposed on the fluorescent member. The photonic structure part includes the inorganic compound layer that is formed of a metal oxide and has a columnar structure extending in a direction away from the fluorescent member. The inorganic compound layer of the photonic structure part has excellent workability (working easiness). Therefore, it is possible to form the photonic structure part having a desired photonic structure (a desired periodic structure). As a result, it is possible to extract the fluorescent light, which is emitted from the phosphor of the fluorescent member, from the surface of the photonic structure part, which serves as the fluorescent light emitting surface of the wavelength conversion member, to the outside with high efficiency. In addition, since the fluorescent light is extracted from the wavelength conversion member with high efficiency, it is possible to suppress or prevent the fluorescent member from being heated by the fluorescent light that cannot exit from the fluorescent light emitting surface. Therefore, the temperature increase of the fluorescent member is suppressed. This makes it possible to suppress reduction in light quantity of the fluorescent light caused by occurrence of temperature quenching in the phosphor. In addition, the shape of the photonic structure part is not deformed by influence of heat generated upon application of the excitation light. Thus, it is possible to extract the fluorescent light from the fluorescent light emitting surface of the wavelength conversion member with high efficiency for a long term.

Consequently, the fluorescent light source device of the present invention can effectively use the fluorescent light, which is generated inside the wavelength conversion member, and emit the fluorescent light to the outside with high efficiency. Thus, the fluorescent light source device of the present invention can achieve high emission efficiency.

In the method of manufacturing the fluorescent light source device according to the present invention, the inorganic compound layer that is formed of a metal oxide and has a columnar structure extending in a direction away from the fluorescent member is formed on the fluorescent member, and the surface of the inorganic compound layer is etched to form the wavelength conversion member. In this way, it is unnecessary to form the periodic structure on the fluorescent member, and the inorganic compound layer formed on the fluorescent member has excellent workability (working easiness). This makes it possible to easily form a desired periodic structure on the surface of the inorganic compound layer. Accordingly, the photonic structure part of the resulting wavelength conversion member part has a desired photonic structure (a desired periodic structure).

Consequently, the method of manufacturing the fluorescent light source device according to the present invention can easily manufacture the fluorescent light source device that is configured to effectively utilize fluorescent light generated inside the wavelength conversion member, emit the fluorescent light to the outside with high efficiency, and achieve high emission efficiency.

DESCRIPTION OF EMBODIMENTS

Embodiments of a fluorescent light source device according to the present invention will now be described below.

Figure 1:
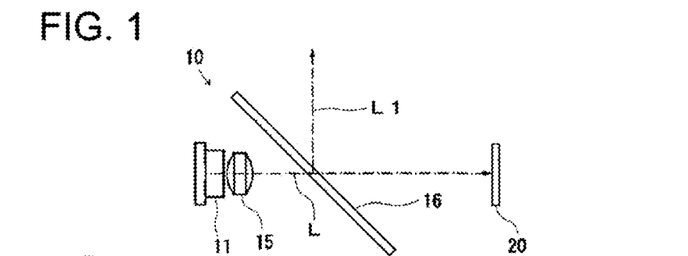
FIG. 1 is a diagram useful to illustrate a schematic configuration of an exemplary fluorescent light source device according to an embodiment of the present invention.
Figure 2:
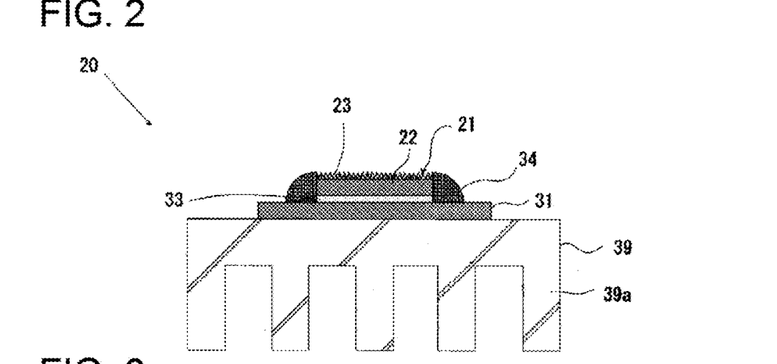
FIG. 2 is a cross-sectional view useful to describe a structure of a fluorescence emitter of the fluorescent light source device shown in FIG. 1.
Figure 3:
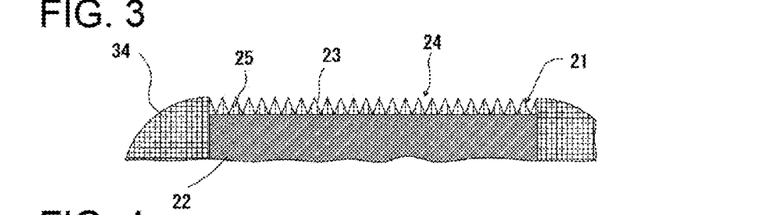
FIG. 3 is an enlarged view useful to illustrate a wavelength conversion member of the fluorescence emitter shown in FIG. 2.
Figure 4:
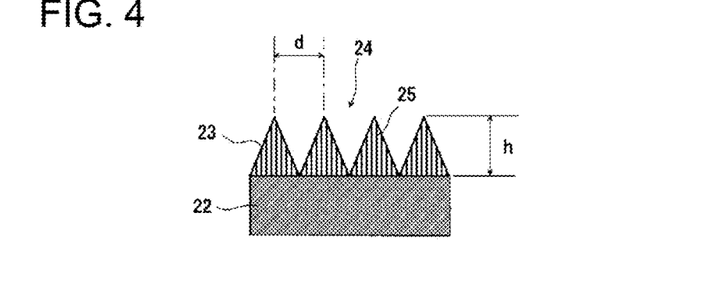
FIG. 4 is a partial cross-sectional view useful to illustrate a surface structure of a photonic structure part of the wavelength conversion member shown in FIG. 3.

FIG. 1 is a view useful to describe an outline of a configuration of an exemplary fluorescent light source device according to the present invention. FIG. 2 is a cross-sectional view useful to describe a structure of a fluorescence emitter of the fluorescent light source device shown in FIG. 1. FIG. 3 is an enlarged view useful to describe a wavelength conversion member of the fluorescence emitter shown in FIG. 2. FIG. 4 is a partial cross-sectional view useful to describe an upper surface (front surface) structure of a photonic structure part of the wavelength conversion member shown in FIG. 3.

As illustrated in FIG. 1, a fluorescent light source device 10 includes a laser diode 11 and a fluorescence emitter that is disposed to face the laser diode 11. The fluorescence emitter 20 has a wavelength conversion member that is excited by excitation light L to emit fluorescent light L1. The excitation light L is laser light emitted from the laser diode 11.

A collimator lens 15 is disposed at a position close to the laser diode 11 between the laser diode 11 and the fluorescence emitter 20. The collimator lens 15 emits, as a parallel beam of light, the excitation light L that has been received from the laser diode 11. A dichroic mirror 16 is disposed between the collimator lens 15 and the fluorescence emitter 20 and is oblique (inclined) to an optical axis of the collimator lens 15 by, for example, an angle of 45 degrees. The dichroic mirror 16 allows the excitation light L received from the laser diode to pass threrethrough, and reflects the fluorescent light L1 received from the wavelength conversion member 21.

As illustrated in FIG. 2, the fluorescence emitter 20 includes the substantially disc-like wavelength conversion member 21 provided on a front surface (an upper surface in FIG. 2) of a rectangular flat plate-shaped substrate 31.

As illustrated in FIG. 3 and FIG. 4, the wavelength conversion member 21 includes a disc-like fluorescent member 22 and a substantially disc-like photonic structure part 23 that is provided on a front surface (an upper surface in FIG. 3 and FIG. 4) of the fluorescent member 22.

In the wavelength conversion member 21, a front surface (an upper surface in FIG. 2 to FIG. 4) of the photonic structure part 23 serves as an excitation light receiving surface, and also serves as a fluorescent light emitting surface.

A back surface of the wavelength conversion member 21, namely, a back surface of the fluorescent member 22 (a lower surface in FIG. 2) has a light reflecting film 33 formed of a multilayer film. An annular diffusion reflecting member 34 is provided on a side surface of the wavelength conversion member 21. The reflecting member 34 is in close contact with the side surface of the wavelength conversion member 21. The diffusion reflecting member 34 may be made from a mixture of silicone and diffusion particles (e.g., alumina particles and titania particles), or a material obtained by drying ceramic paste or the like containing alkali metal elements. In this way, the wavelength conversion member 21 has the light reflecting film 33 and the diffusion reflecting member 34, thereby possessing a reflection function on the back surface and the side surface. A bonding member (not illustrated) is interposed between the light reflecting film 33 and the substrate 31, and the wavelength conversion member 21 is bonded on the substrate 31 by the bonding member. The bonding member may be solder, a silver sintered material, or the like when heat exhausting property is taken into account. Also, a heat radiation member 39 formed of a metal such as copper is disposed on a back surface of the substrate 31. The heat radiation member 39 has a heat radiation fin 39a.

The photonic structure part 23 includes, on the fluorescent light emitting surface (i.e., the front surface of the photonic structure part 23), a periodic structure 24. The periodic structure has a plurality of projections 25 that are arranged two-dimensionally and periodically. The periodic structure 24 constitutes a photonic structure.

The photonic structure used herein indicates a two-dimensional periodic structure, and more specifically indicates a rugged structure in which a plurality of projections are arranged two-dimensionally and periodically.

In the illustrated embodiment, the periodic structure 24 of the photonic structure part 23 has the substantially conical projections 25 that are densely arranged two-dimensionally and periodically.

In the periodic structure 24, a period d is a value within a range in which diffraction of the fluorescent light L1 emitted from the phosphor of the fluorescent member 22 occurs (Bragg condition).

More specifically, the period d of the periodic structure 24 is a value (hereinafter, referred to as an "optical length") obtained by dividing a peak wavelength of the fluorescent light L1 emitted from the phosphor by a refractive index of a material of the periodic structure 24 (specifically, the inorganic compound layer), or a value of about several times of the optical length.

In this specification, the period of the periodic structure refers to a distance (nm) between centers of the projections adjacent to each other in the periodic structure.

When the period d of the periodic structure 24 is a value within the range that allows diffraction of the fluorescent light L1 to occur in the fluorescent member 22, it becomes possible to emit the fluorescent light L1 from the front surface of the wavelength conversion member 21 to outside with high efficiency.

An aspect ratio (hereinafter, occasionally referred to as a "periodic structure aspect ratio"), which is a ratio (h/d) of a height h of each projection 25 to the period d in the periodic structure 24, is preferably equal to or greater than 0.2.

When the periodic structure aspect ratio is equal to or greater than 0.2, it is possible to extract, with high efficiency, the fluorescent light L1, which is received from the phosphor of the fluorescent member 22, from the front surface of the photonic structure part 23, which serves as the fluorescent light emitting surface of the wavelength conversion member 21.

Also, when the periodic structure aspect ratio is equal to or greater than 0.2, it is possible to prevent the excitation light L from being reflected by the front surface of the photonic structure part 23 (i.e., the front surface of the wavelength conversion member 21). Thus, it is possible to sufficiently take the excitation light L into the wavelength conversion member 21 when the excitation light L is applied to the front surface of the photonic structure part 23.

The photonic structure part 23 includes an inorganic compound layer (hereinafter, occasionally referred to as a "specific inorganic compound layer"). The inorganic compound layer is formed of a metal oxide and has a columnar structure extending in a direction away from the fluorescent member 22 (upward in FIG. 2 to FIG. 4). In other words, the photonic structure part 23 includes the specific inorganic compound layer, and the periodic structure 24 provided on a front surface (upper surface) of the specific inorganic compound layer.

The specific inorganic compound layer of the photonic structure part 23 has a plurality of unit columns (inorganic compound columnar units), and each of the unit columns extends in the direction away from the fluorescent member 22. In addition, the specific inorganic compound layer has a porous structure in which fine spaces are formed between adjacent unit columns.

In the photonic structure part 23, the projections 25 may preferably have a plurality of unit columns, respectively. In other words, each projection 25 preferably has one unit column (or is preferably defined by one unit column).

When each projection 25 is configured by a single unit column, it becomes possible to allow the respective projection 25 to have a desired shape in a reliable manner by the method of manufacturing the fluorescent light source device, or a process of forming the wavelength conversion member (will be described later).

Specific examples of a material of the specific inorganic compound layer of the photonic structure part 23 may include metal oxides such as alumina ($Al_2O_3$), hafnium oxide ($HhO_2$), magnesium oxide ($MgO$), tin oxide ($SnO_2$), tungsten oxide ($WO_3$), yttrium oxide ($Y_2O_3$), indium tin oxide (ITO), zirconia ($ZrO_2$), tantalum oxide ($Ta_2O_5$), titanium oxide ($TiO_2$), and niobium oxide ($Nb_2O_5$), and a mixture of zirconia ($ZrO_2$) and titanium oxide ($TiO_2$). Among these materials, zirconia (thermal expansion coefficient: $10.5\times10^{-6}$/K), indium tin oxide (thermal expansion coefficient: $6.8\times10^{-6}$/K), and titanium oxide (thermal expansion coefficient: $7.9\times10^{-6}$/K) are preferred because each of the materials has a thermal expansion coefficient approximate to a thermal expansion coefficient ($6\times10^{-6}$/K to $8\times10^{-6}$/K) of the phosphor (LuAG, YAG). In particular, zirconia is more preferred because zirconia has a small absorption coefficient, i.e., 13 $cm^{-1}$ (an absorption coefficient with respect to light having a wavelength of 550 nm).

The specific inorganic compound layer of the photonic structure part 23 may preferably have a high refractive index. More specifically, the refractive index of the specific inorganic compound layer may preferably be equal to or higher than a refractive index of the fluorescent member 22. When the photonic structure part 23 includes the specific inorganic compound layer having the refractive index higher than that of the fluorescent member 23, the fluorescent light L1 that has entered an interface between the fluorescent member 22 and the photonic structure part 23 is refracted upon passing through the interface. Accordingly, the traveling direction of the fluorescent light L1 is altered at the interface between the fluorescent member 22 and the photonic structure part 23. This suppresses confinement of the fluorescent light L1 inside the wavelength conversion member 21. As a result, it is possible to emit the fluorescent light L1 from the front surface of the photonic structure part 23 to the outside with high efficiency.

Using the specific inorganic compound layer having the higher refractive index than that of the fluorescent member 22 makes it possible to form the periodic structure 24 with the small period d. Then, it becomes possible to design the protrusions 25 of the periodic structure 24 with a large aspect ratio (the large periodic structure aspect ratio) and small height. Therefore, the preparation of the periodic structure 24 becomes easy. For example, in the process of forming the wavelength conversion member (will be described later), a soft mold can easily be fabricated, and a resist pattern film (an imprint operation) can easily be fabricated.

A thickness of the photonic structure part 23 may be, for example, within a range from 0.05 μm to 1.0 μm.

In the illustrated embodiment, the thickness of the photonic structure part 23 is equal to the height h of the protrusion 25.

The fluorescent member 22 contains a phosphor. More specifically, the fluorescent member is formed of a single-crystal or poly-crystal phosphor, or a sintered body (compact) of a mixture of ceramic binder and a single-crystal or poly-crystal phosphor. In other words, the fluorescent member 22 is formed of a single-crystal or poly-crystal phosphor.

In the sintered body of the mixture of the phosphor and the ceramic binder, which is used as the fluorescent member 22, nanosized alumina particles are used as the ceramic binder. The sintered body is obtained by mixing several mass % to several tens mass % of the ceramic binder to 100 mass % of the phosphor, pressing the mixture, and then sintering the mixture.

When the fluorescent member 22 is made from a single-crystal or poly-crystal phosphor, the fluorescent member 22 has high thermal conductivity. Therefore, heat generated upon application of the fluorescent light L is efficiently exhausted from the fluorescent member 22, and the temperature of the fluorescent member 22 does not become high.

The single-crystal phosphor of the fluorescent member 22 may be obtained through, for example, Czochralski method. More specifically, a seed crystal is brought into contact with a melted raw material in a crucible, and in this state, the seed crystal is drawn up in a vertical direction while being rotated, to grow the single crystal on the seed crystal, thereby resulting in the single-crystal phosphor.

The poly-crystal phosphor of the fluorescent member 22 may be obtained in the following manner, for example. Firstly, raw materials of a base material, an activator, a sintering auxiliary, and the like are ground or pulverized by, for example, a ball mill to form raw material fine particles each having a particle size of submicron or less. Subsequently, the raw material fine particles are used to form a molded compact through, for example, a slip casting method. The molded compact is then sintered. Thereafter, hot isostatic pressure processing (hot isotropic pressing) is performed on the sintered compact to form a poly-crystal phosphor having a porosity of 0.5 or less, for example.

Specific examples of the phosphor of the fluorescent member 22 may include YAG ($Y_3Al_5O_{12}$), LuAG ($Lu_3Al_5O_{12}$), CASN ($CaAlSiN_3$:Eu), and SCASN (($Sr,Ca$)$AlSiN_3$:Eu).

The thickness of the fluorescent member 22 may be, for example, within a range of 0.05 mm to 2.0 mm when conversion efficiency (quantum yield) of the excitation light L to the fluorescent light L1 and heat exhausting property are taken into account.

The material of the substrate 31 may be an aluminum substrate with a heat radiation adhesive. The heat radiation adhesive contains resin, and metal fine powder is mixed with the resin. The thickness of the substrate 31 may be, for example, within a range of 0.5 mm to 1.0 mm.

The fluorescent light source device 10 having the above-described configuration may be manufactured by, for example, forming the wavelength conversion member 21 through a particular process that will be described below.

More specifically, the wavelength conversion member 21 is formed by a process of forming, on the fluorescent member 22, the inorganic compound layer having a columnar structure extending in the direction away from the fluorescent member 22, and etching the front surface of the inorganic compound layer (hereinafter occasionally referred to as the "process of forming the wavelength conversion member").

The process of forming the wavelength conversion member will be described in detail with reference to FIG. 5 to FIG. 11.

Figure 11:
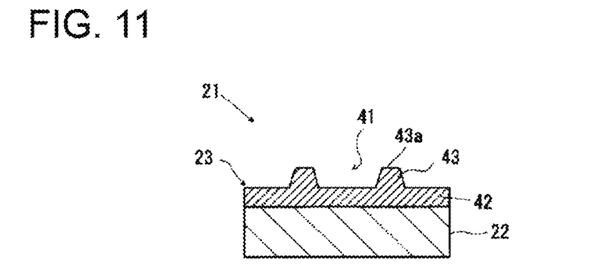
FIG. 11 is a cross-sectional view useful to illustrate a structure of the wavelength conversion member obtained in the process of forming the wavelength conversion member in the exemplary method for manufacturing the fluorescent light source device according to the embodiment of the present invention.

As illustrated in FIG. 11, the wavelength conversion member 21 formed through the process of forming the wavelength conversion member illustrated in FIG. 5 to FIG. 11 is different in the structure of the photonic structure part 23 from the wavelength conversion member 21 shown in FIG. 1. More specifically, the wavelength conversion member 21 shown in FIG. 11 includes the photonic structure part 23, which has a thin film part 42, and a plurality of (two in FIG. 11) projections 43 formed on the thin film part 42. The projections 43 each have a truncated cone shape, and are arranged separately from one another at fixed intervals. The thin film part 42 and the projections 43 constitute, on the front surface (an upper surface in FIG. 11) of the photonic structure part 23, a periodic structure 41 in which the projections 43 are arranged two-dimensionally and periodically.

Figure 5:
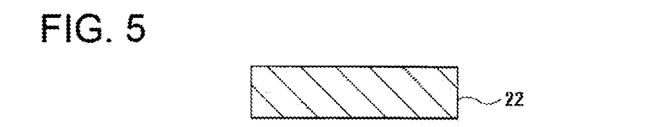
FIG. 5 is a cross-sectional view useful to describe a fluorescent member used in a process of forming a wavelength conversion member in an exemplary method for manufacturing a fluorescent light source device according to an embodiment of the present invention.

Firstly, as illustrated in FIG. 5, the fluorescent member 22 is prepared and cleaned with an organic solvent.

In the illustrated embodiment, the fluorescent member 22 has a flat disc shape with a diameter of 50.8 mm and a thickness of 0.13 mm. A front surface and a back surface of the fluorescent member 22 are polished.

Figure 6:
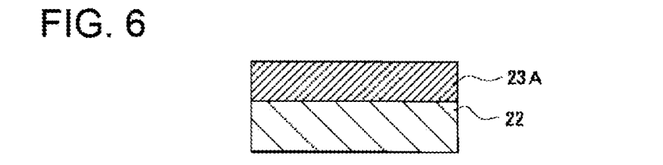
FIG. 6 is a cross-sectional view useful to describe an inorganic compound layer that is formed on the fluorescent member in the process of forming the wavelength conversion member in the exemplary method for manufacturing the fluorescent light source device according to the embodiment of the present invention.

Then, as illustrated in FIG. 6, the inorganic compound layer (hereinafter, also referred to as a "photonic structure part forming layer") 23A, which will eventually become the photonic structure part 23, is formed on the entire front surface (an upper surface in FIG. 6) of the fluorescent member 22. The photonic structure part forming layer 23A is made from a metal oxide. The photonic structure part forming layer 23A is an inorganic compound layer having a columnar structure. The columnar structure extends in the direction away from the fluorescent member 22. The front surface (upper surface in FIG. 6) of the photonic structure forming layer 23A is substantially flat.

Preferably, a method of forming the photonic structure part forming layer 23A is a sputtering method.

When the sputtering method is used, it is possible to adjust sputtering conditions, and control a form of a sputtering film to be formed. Thus, it is possible to easily form the photonic structure part forming layer 23A having a desired columnar structure.

The sputtering method used herein includes a reactive sputtering method. In a case where a sputtering film is formed through the reactive sputtering method, a reactive sputtering apparatus is used.

In the photonic structure part forming layer 23A, the unit column of the photonic structure part forming layer 23A may preferably have a ratio of a vertical length (height) to a lateral width (hereinafter, also referred to as a "unit column aspect ratio") of 1.3 or more.

When the unit column aspect ratio is set within the above-described range, etching workability of the photonic structure part forming layer 23A (i.e., easiness of the etching) is improved. Thus, it is possible to form the photonic structure part 23 in the desired shape.

In order to form the photonic structure part forming layer 23A through the sputtering method, it is necessary to control (appropriately decide) the sputtering conditions.

More specifically, it is preferred that a high-frequency electric power to be applied between the fluorescent member 22 and a target substance is reduced, and a flow rate of inert gas is reduced.

Making the high-frequency electric power to be applied small makes it possible to decrease the temperature of the fluorescent member 22 during the process of forming the sputtering film. As a result, it is possible to suppress recrystallization in the sputtering film formed on the fluorescent member 22, and to allow the resulting sputtering film to have a desired columnar structure.

Setting the flow rate of the inert gas relatively small makes it possible to form dense sputtering film on the fluorescent member 22. More specifically, it is possible to form a sputtering film that has a large unit column aspect ratio, has a porous structure in which fine spaces are formed between the unit columns, and has a high refractive index.

In order to form the sputtering film having a high refractive index, oxygen gas may be preferably introduced together with the inert gas.

More specifically, in a case where a sputtering film of zirconia is formed as the photonic structure part forming layer 23A by a sputtering apparatus, the high-frequency electric power to be applied between the fluorescent member 22 and the target substance (zirconia) may be preferably 450 W or lower, and more preferably 250 W or lower.

Also, the flow rate of the inert gas such as argon gas may be preferably within a range of 1 sccm to 20 sccm. The flow rate of the oxygen gas introduced together with the inert gas as necessary may be preferably within a range of 0.1 sccm to 3 sccm.

In the illustrated embodiment, the photonic structure part forming layer 23A was formed of the sputtering film of zirconia, and had a thickness of about 600 nm (e.g., 550 nm). The photonic structure part forming layer 23A was formed by the sputtering apparatus, with zirconia being the target substance, under the following conditions: the high-frequency electric power was 250 W, the flow rate of the argon gas (i.e., the inert gas) was 20 sccm, the flow rate of the oxygen gas was 0.5 sccm, and the sputtering time was four hours. The temperature (the surface temperature) of the fluorescent member 22 was 100 degrees C. or lower during the formation of the sputtering film.

Subsequently, a resist film is formed on the front surface (the upper surface in FIG. 6) of the photonic structure part forming layer 23A formed on the fluorescent member 22 through, for example, a spin coating method, and then the resist film is patterned through a nanoimprint method.

Figure 7:
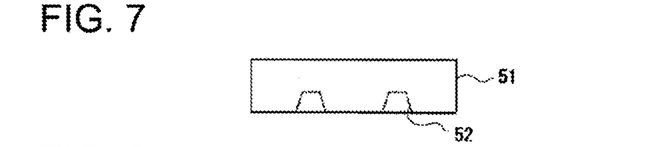
FIG. 7 is a diagram useful to illustrate a soft mold used in the process of forming the wavelength conversion member in the exemplary method for manufacturing the fluorescent light source device according to the embodiment of the present invention.

In order to perform the patterning on the resist film through the nanoimprint method, firstly, as illustrated in FIG. 7, a soft mold 51 having a pattern corresponding to the periodic structure 41 in the photonic structure part 23 to be formed (more specifically, a pattern in which a plurality of recesses 52 are arranged) is formed. The soft mold 51 may be a mold made from a thermosetting material, or a mold made from an ultraviolet curable material.

Figure 8:
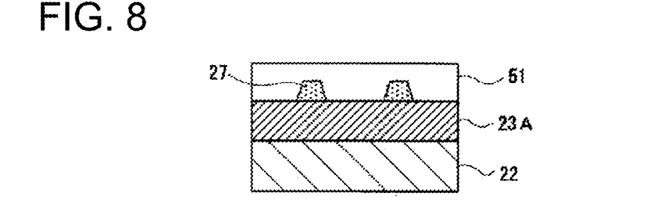
FIG. 8 is a cross-sectional view useful to illustrate the soft mold that is pressed against a resist film formed on the inorganic compound layer in the process of forming the wavelength conversion member in the exemplary method for manufacturing the fluorescent light source device according to the embodiment of the present invention.
Figure 9:
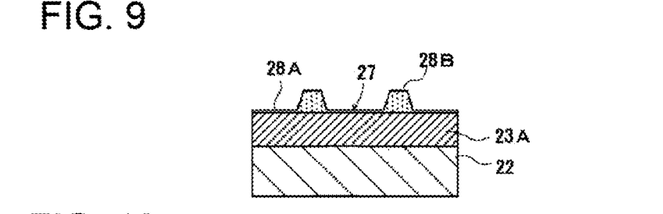
FIG. 9 is a cross-sectional view useful to illustrate a resist pattern film that is formed on the inorganic compound layer in the process of forming the wavelength conversion member in the exemplary method for manufacturing the fluorescent light source device according to the embodiment of the present invention.

Then, as illustrated in FIG. 8, the nanoimprint apparatus is used to press the soft mold 51 against the resist film formed on the photonic structure part forming layer 23A, thereby transferring the pattern formed on the soft mold 51 onto the resist film. As a result, as illustrated in FIG. 9, a resist pattern film 27 with a period of 460 nm is formed on the photonic structure part forming layer 23A.

In the illustrated embodiment, the resist pattern film 27 is formed to cover the entire front surface of the photonic structure part forming layer 23A. The resist pattern film 27 includes a thin film part 28A formed on the front surface of the photonic structure part forming layer 23A, and a plurality of projections 28B formed on the thin film part 28A. The projections 28B are arranged at fixed intervals corresponding to the projections 43 of the periodic structure 41 of the photonic structure part 23 to be formed. The fixed interval (period) is 460 nm. The interval or period is a distance between the centers of each two adjacent projections 28B.

Figure 10:
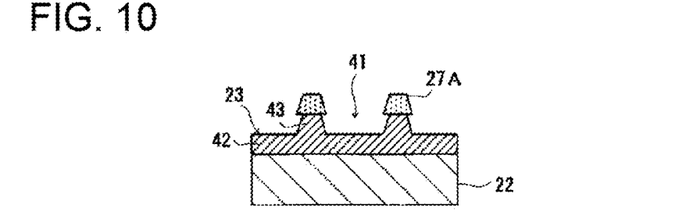
FIG. 10 is a cross-sectional view useful to illustrate the inorganic compound layer that is etched in the process of forming the wavelength conversion member in the exemplary method for manufacturing the fluorescent light source device according to the embodiment of the present invention.

Then, dry etching is performed on the photonic structure part forming layer 23A, which has the resist pattern film 27 on the front surface thereof. This step results in the photonic structure part 23 having the periodic structure 41 on the front surface (an upper surface in FIG. 10) as illustrated in FIG. 10.

The dry etching method may be an inductive coupling plasma (ICP) etching method.

The conditions for forming the periodic structure 41 through the ICP etching method are appropriately determined on the basis of the shape of the periodic structure 41 (e.g., the shape of the projection 43, the periodic structure aspect ratio, and the like). If necessary, the material of the photonic structure part forming layer 23A, the unit column aspect ratio, and other factors are also taken into account.

Specifically, examples of etching gas may include silane gas ($SiH_4$), silicon tetrafluoride gas ($SiF_4$), diborane gas ($B_2H_6$), and boron trichloride gas ($BCl_3$). The high-frequency electric power is within a range of 100 W to 700 W, and the bias electric power is within a range of 1 W to 30 W.

In the illustrated embodiment, the periodic structure 41 of the photonic structure part 23 was formed through the ICP etching method with the boron trichloride gas ($BCl_3$), which was the etching gas, under the following conditions: the high-frequency electric power was 700 W, the bias electric power was 20 W, and the processing time was 350 seconds.

Thereafter, a remaining film 27A of the resist pattern film 27, which remains on the photonic structure part 23, is removed with use of an organic solvent to form the wavelength conversion member 21 having a structure illustrated in FIG. 11.

Figure 12:
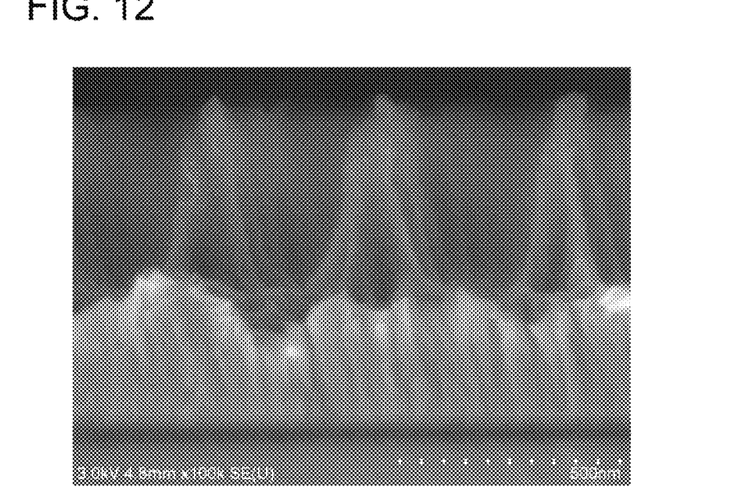
FIG. 12 is an SEM photograph of the wavelength conversion member obtained through the process of forming the wavelength conversion member shown in FIG. 5 to FIG. 11.

In the illustrated embodiment, FIG. 12 is an SEM photograph of the wavelength conversion member 21, which was prepared in the above-described manner. The unit column aspect ratio of the wavelength conversion member 21 was 9.3.

Then, the wavelength conversion member 21 thus formed is bonded on the substrate 31 in a state where the light reflecting film 33 and the diffusion reflecting member 34 are provided as necessary, to form the fluorescence emitter 20. The fluorescence emitter 20, the laser diode 11, and other components are disposed at appropriate positions to complete the fluorescent light source device 10.

In the fluorescent light source device 10, the excitation light L that is laser light emitted from the laser diode 11 is converted into parallel light by the collimator lens 15. Thereafter, the excitation light L passes through the dichroic mirror 16, and is then applied in a substantially perpendicular direction to the excitation light receiving surface of the wavelength conversion member 21 of the fluorescence emitter 20 (i.e., the front surface of the photonic structure part 23), thereby entering the fluorescent member 22 through the photonic structure part 23. Then, the phosphor of the fluorescent member 22 is excited in the fluorescent member 22.

As a result, in the fluorescent member 22, the fluorescent light L1 is emitted from the phosphor. The fluorescent light is emitted from the fluorescent light emitting surface (i.e., the front surface of the photonic structure part 23), and is reflected by the dichroic mirror 16 in a perpendicular direction. The fluorescent light L1 is then emitted to the outside from the fluorescent light source device 10.

In such fluorescent light source device 10, the wavelength conversion member 21 includes the photonic structure part 23 on the front surface of the fluorescent member 22. The excitation light receiving surface and the fluorescent light emitting surface are parts of the front surface of the photonic structure part 23. The periodic structure 24 in which the substantially conical projections 25 are arranged two-dimensionally and periodically is provided on the front surface of the photonic structure part 23. Accordingly, it is possible to extract, with high efficiency, the fluorescent light L1 that is emitted from the phosphor of the fluorescent member 22, from the front surface of the photonic structure part 23 to the outside. The front surface of the photonic structure part 23 serves as the fluorescent light emitting surface of the wavelength conversion member 21. In addition, because the fluorescent light L1 is extracted from the wavelength conversion member 21 with high efficiency, it is possible to reduce a possibility that the fluorescent member 22 be heated by the fluorescent light L1 that cannot be emitted from the fluorescent light emitting surface. Consequently, the temperature increase of the fluorescent member 22 is suppressed, and a reduction in light quantity of fluorescent light that is caused by occurrence of temperature quenching in the phosphor is suppressed.

The material of the photonic structure part 23 is an inorganic compound (a metal oxide). Therefore, the photonic structure part 23 is not deformed by influence of heat such as heat of the laser light (i.e., the excitation light L). Thus, when the wavelength conversion member 21 is used, it is possible to extract the fluorescent light L1 from the fluorescent light emitting surface with high efficiency for a long term.

Consequently, according to the fluorescent light source device 10, the fluorescent light L1 generated inside the wavelength conversion member 21 is effectively used and emitted to the outside with high efficiency. Thus, the fluorescent light source device 10 can achieve high emission efficiency.

The fluorescent light source device 10 includes the wavelength conversion member 21 that has the fluorescent member 22 and the photonic structure part 23. Thus, it is unnecessary for the fluorescent member 22 to have a periodic structure. In addition, the specific inorganic compound layer of the photonic structure part 23 has excellent workability (working easiness). Therefore, it is possible to easily form the periodic structure 24 having a desired shape through the wavelength conversion member forming process.

Although the particular embodiment of the present invention has been described in the foregoing, the present invention is not limited to the above-described embodiment, and various changes and modifications may be made to the embodiment.

For example, the photonic structure (the periodic structure) of the photonic structure part is not limited to the periodic structure shown in FIG. 1 to FIG. 4 as long as the photonic structure part of wavelength conversion member formed on the fluorescent member includes the specific inorganic compound layer. Specifically, the wavelength conversion member may include any of those structures which are illustrated in FIG. 11, and FIG. 13 to FIG. 15.

Figure 13:
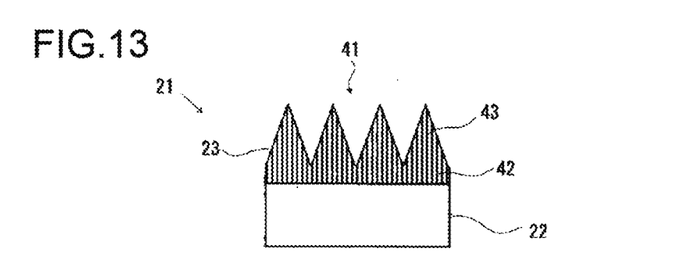
FIG. 13 is a cross-sectional view useful to illustrate a surface structure of a photonic structure part of a wavelength conversion member in another exemplary fluorescent light source device according to an embodiment of the present invention.

More specifically, the photonic structure part 23 shown in FIG. 13 has a structure similar to that of the photonic structure part 23 shown in FIG. 1 except that the photonic structure part 23 shown in FIG. 13 includes the thin film part 42 provided on the front surface of the fluorescent member 22 and a plurality of (four in FIG. 13) spindle-shaped (for example, generally conical) projections 43 provided on the thin film part 42.

Figure 14:
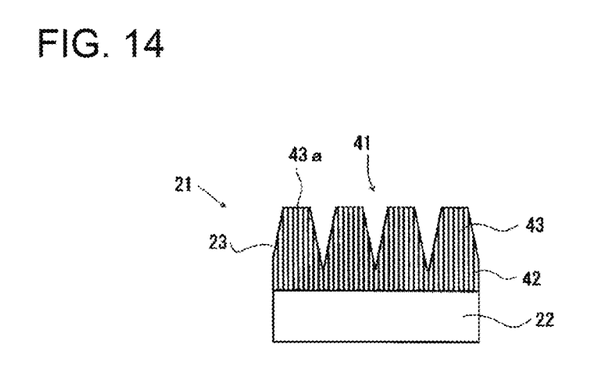
FIG. 14 is a cross-sectional view useful to illustrate a surface structure of a photonic structure part of a wavelength conversion member in still another exemplary fluorescent light source device according to an embodiment of the present invention.

The photonic structure part 23 shown in FIG. 14 has a structure similar to that of the photonic structure part 23 shown in FIG. 13 except that each projection 43 has a truncated cone shape (for example, a circular truncated cone shape).

Figure 15:
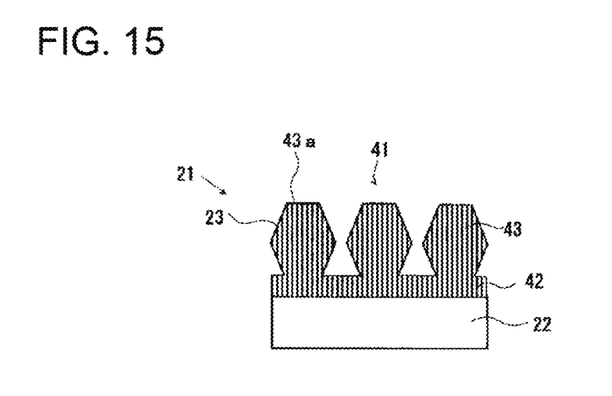
FIG. 15 is a cross-sectional view useful to illustrate a surface structure of a photonic structure part of a wavelength conversion member in yet another exemplary fluorescent light source device according to an embodiment of the present invention.

The photonic structure part 23 of FIG. 15 has a structure similar to that of the photonic structure part 23 shown in FIG. 13 except that the projections 43 each has a hexagonal cross section in a height direction of the projections 43 and are arranged separately from one another at fixed intervals. In the configuration shown in FIG. 15, a shape of a cross-section of the projection 43 in a direction perpendicular to the height direction of the projections 43 is circular.

When the projections 43 each have a flat front end 43a as illustrated in FIG. 11, FIG. 14, and FIG. 15, a size (a maximum size) of the front end 43a is smaller than the wavelength of the excitation light L.

As illustrated in FIG. 11, FIG. 14, and FIG. 15, when the photonic structure part 23 includes the thin film part 42 and the projections 43, the photonic structure part 23 and the fluorescent member 22 are bonded with strong adhesion. Thus, occurrence of detachment between the photonic structure part 23 and the fluorescent member 22 is suppressed.

As illustrated in FIG. 11, FIG. 14, and FIG. 15, when the front end 43a of each projection 43 is flat, breakage that would be caused by contact between the front end 43a of each projection 43 and other component (e.g., the dichroic mirror 16) is suppressed, for example, in a component assembling process of the fluorescent light source device manufacturing method.

It is sufficient for the wavelength conversion member to have the fluorescent light emitting surface thereof formed by the front surface of the photonic structure part. Also, the excitation light receiving surface of the wavelength conversion member may be formed by, for example, the back surface of the fluorescent member.

The configuration of the entire fluorescent light source device is not limited to that illustrated in FIG. 1, and various configurations may be employed. For example, the fluorescent light source device shown in FIG. 1 uses light of the sole laser diode 11; however, a plurality of laser diodes may be provided, and a light condensing lens or lenses may be disposed in front of the wavelength conversion member to apply condensed light to the wavelength conversion member. Also, the excitation light is not limited to the light emitted from the laser diode. For example, the excitation light may be condensed light of light emitted from LEDs (light emitting diodes) as long as the condensed light can excite the phosphor in the wavelength conversion member. Alternatively, the excitation light may be light emitted from a lamp in which mercury, xenon, or the like is sealed, as long as the light can excite the phosphor in the wavelength conversion member. It should be noted that when a light source has a certain range for the radiation wavelength (e.g., a lamp and an LED), the wavelength of the excitation light falls in a range of a main radiation wavelength. The present invention, however, is not limited in this regard.

REFERENCE NUMERALS AND SYMBOLS

10 Fluorescent light source device
11 Laser diode
15 Collimator lens
16 Dichroic mirror
20 Fluorescence emitter
21 wavelength conversion member
22 Fluorescent member
23 Photonic structure part
23A Inorganic compound layer (photonic structure part forming layer)
24 Periodic structure
25 Projection
27 Resist pattern film
27A Remaining film
28A Thin film part
28B Projection
31 Substrate
33 Light reflecting film
34 Diffusion reflecting member
39 Heat radiation member
39a Heat radiation fin
41 Periodic structure
42 Thin film part
43 Projection
43a Front end
51 Soft mold
52 Recess
61 Fluorescent member
62 Substrate
63 Barium sulfate layer
65 Heat radiation member
65a Heat radiation fin
L Excitation light
L1 Fluorescent light

The invention claimed is:

1. A fluorescent light source device comprising:
a wavelength conversion member formed of a phosphor, the phosphor being excited by excitation light;
the wavelength conversion member including:
a fluorescent member containing the phosphor; and
a photonic structure part formed on the fluorescent member, the photonic structure part having a surface that serves as a fluorescent light emitting surface of the wavelength conversion member, and the photonic structure part having an inorganic compound layer, and the inorganic compound layer having a columnar structure that extends in a direction away from the fluorescent member, the photonic structure part having a sole refractive index.

2. The fluorescent light source device according to claim 1, wherein the columnar structure includes a plurality of unit columns, the columnar structure defines a periodic structure on the surface of the photonic structure part, the periodic structure includes a plurality of projections that are arranged two-dimensionally and periodically, and each of the plurality of projections is said each unit column of the columnar structure.

3. A method of manufacturing a fluorescent light source device, the fluorescent light source device having a wavelength conversion member formed of a phosphor to be excited by excitation light, the method comprising:
forming an inorganic compound layer on a fluorescent member, the fluorescent member containing the phosphor, the inorganic compound layer having a columnar structure extending in a direction away from the fluorescent member, the inorganic compound layer having a sole refractive index; and etching a surface of the inorganic compound layer to form the wavelength conversion member, the wavelength conversion member including the fluorescent member and a photonic structure part, the photonic structure part having the inorganic compound layer with the etched surface.

4. The method of manufacturing the fluorescent light source device according to claim 3, wherein the inorganic compound layer is formed through sputtering.

5. The fluorescent light source device according to claim 1 further comprising a light reflecting film such that the fluorescent member is disposed on the light reflecting film.

6. The fluorescent light source device according to claim 1 further comprising a diffusion reflecting member disposed on a lateral side of the wavelength conversion member.

7. The fluorescent light source device according to claim 5 further comprising a substrate such that the light reflecting member is disposed on the substrate.

8. The fluorescent light source device according to claim 7 further comprising a heat radiating member such that the substrate is disposed on the heat radiating member.

9. The fluorescent light source device according to claim 2, wherein each said projection has a generally conical shape.

10. The fluorescent light source device according to claim 2, wherein a distance between each two adjacent said projections has a value that allows diffraction of fluorescence, which is emitted from the phosphor of the fluorescent member, to occur.

11. The fluorescent light source device according to claim 2, wherein an aspect ratio of the periodic structure, which is obtained by dividing a height of each said projection by a distance between each two adjacent said projections, is equal to or greater than 0.2.

12. The fluorescent light source device according to claim 1, wherein the refractive index of the photonic structure part is equal to or greater than a refractive index of the fluorescent member.

13. The fluorescent light source device according to claim 1, wherein a thickness of the photonic structure is 0.05 μm to 1.0 μm.

14. The fluorescent light source device according to claim 1, wherein the phosphor is a single-crystal phosphor or a multi-crystal phosphor.

15. The fluorescent light source device according to claim 1, wherein a thickness of the fluorescent member is 0.05 mm to 2.0 mm.

16. The fluorescent light source device according to claim 1, wherein the inorganic compound layer is formed of a metal oxide, or a mixture of zirconia and titanium oxide.

17. The fluorescent light source device according to claim 1, wherein the excitation light is light from a laser unit, an light-emitting diode, a mercury lamp or a xenon lamp.

18. The method of manufacturing the fluorescent light source device according to claim 3, wherein the inorganic compound layer is formed of a metal oxide, or a mixture of zirconia and titanium oxide.

19. The method of manufacturing the fluorescent light source device according to claim 3, wherein the excitation light is light from a laser unit, an light-emitting diode, a mercury lamp or a xenon lamp.

* * * * *